United States Patent
Bauer et al.

(10) Patent No.: US 11,493,582 B2
(45) Date of Patent: Nov. 8, 2022

(54) GRADIENT COIL UNIT FOR A MAGNETIC RESONANCE DEVICE

(71) Applicant: Siemens Healthcare GmbH, Erlangen (DE)

(72) Inventors: Simon Bauer, Eggolsheim (DE); Peter Dietz, Fuerth (DE); Andreas Johannes Fischer, Erlangen (DE); Lothar Schoen, Neunkirchen (DE)

(73) Assignee: Siemens Healthcare GmbH, Erlangen (DE)

( * ) Notice: Subject to any disclaimer, the term of this patent is extended or adjusted under 35 U.S.C. 154(b) by 107 days.

(21) Appl. No.: 17/160,543

(22) Filed: Jan. 28, 2021

(65) Prior Publication Data

US 2021/0231759 A1 Jul. 29, 2021

(30) Foreign Application Priority Data

Jan. 28, 2020 (DE) .......................... 202020100449.2

(51) Int. Cl.
*G01R 33/385* (2006.01)

(52) U.S. Cl.
CPC .................. *G01R 33/3858* (2013.01)

(58) Field of Classification Search
CPC ............ G01R 33/3858; G01R 33/3873; G01R 33/385
See application file for complete search history.

(56) References Cited

FOREIGN PATENT DOCUMENTS

WO    WO-2021124877 A1 *  6/2021

* cited by examiner

*Primary Examiner* — Susan S Lee
(74) *Attorney, Agent, or Firm* — Banner & Witcoff Ltd.

(57) ABSTRACT

A gradient coil unit includes a primary coil, a secondary coil and a carrier unit. The carrier unit stabilizes the primary coil and the secondary coil, and is formed from an encapsulating material. The carrier unit may include at least two encapsulating pockets that each include a delimiting structure and a filling. A thermoset component unit includes an electronic component and a carrier unit surrounding the electronic component, and being formed from an encapsulating material. The carrier unit may include at least one encapsulating pocket that includes a delimiting structure having a first material, and a filling having a second material.

20 Claims, 6 Drawing Sheets

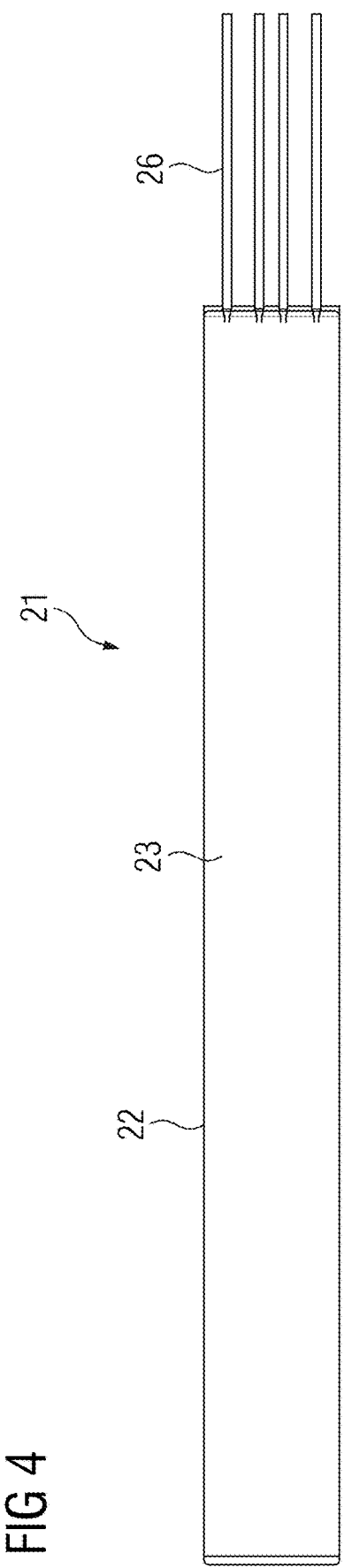
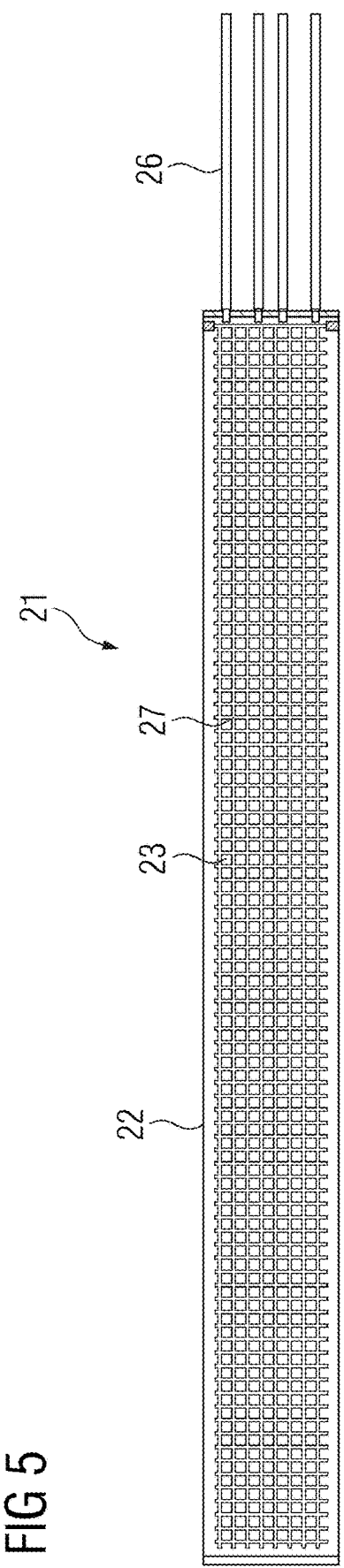

GRADIENT COIL UNIT FOR A MAGNETIC RESONANCE DEVICE

CROSS REFERENCE TO RELATED APPLICATIONS

This patent application claims priority to German Patent Application No. 20 2020 100 449.2, filed Jan. 28, 2020, which is incorporated herein by reference in its entirety.

BACKGROUND

Field

The disclosure relates to a gradient coil unit comprising a primary coil, a secondary coil and a carrier unit, where the carrier unit comprises at least one encapsulating pocket. The disclosure also relates to a thermoset component unit comprising an electronic component and a carrier unit, where the carrier unit comprises an encapsulating pocket.

Related Art

In a magnetic resonance device, also called a magnetic resonance tomography system, the body to be examined of an examination object, in particular a patient, is exposed to a relatively strong basic magnetic field, for example 1.5 or 3 tesla. In addition, gradient pulses are applied with the aid of a gradient coil unit. High-frequency radio-frequency pulses (RF pulses), in particular excitation pulses, are then emitted via a radio-frequency antenna unit by means of suitable antenna devices, with the result that the nuclear spins of specific protons excited into resonance by these RF pluses are tilted through a defined flip angle relative to the magnetic field lines of the basic magnetic field. Upon relaxation of the nuclear spins, radio-frequency signals, so-called magnetic resonance signals, are emitted and are received by suitable radio-frequency antennas and then further processed. Finally, the desired image data can be reconstructed from the raw data acquired in this way.

A gradient coil unit typically comprises three primary coils and three secondary coils corresponding thereto. A primary coil is typically configured to generate a magnet field gradient in one spatial direction. A secondary coil corresponding thereto screens the magnetic field gradient generated by the primary coil such that this is compensated outside the gradient coil unit and/or no magnet field gradient forms outside the gradient coil unit. The primary coils and the secondary coils are controlled with electric currents with amplitudes of up to several 100 A, which are subject to frequent and rapid changes in the direction of current with rising and falling rates of several 100 kA/s. A gradient coil unit is typically arranged within the basic magnet, as a result of which Lorentz forces act on the gradient coil unit and the connector cables thereof during the operation of the gradient coil unit, thus resulting in vibrations of the gradient coil unit.

The primary coil and the secondary coil are typically connected to one another by means of an encapsulating material. In particular, the primary coil and the secondary coil are encapsulated with the encapsulating material such that they are in a fixed arrangement to one another and typically form a hollow cylinder together with the encapsulating material. After encapsulation, in particular during the curing of the encapsulating material, thermal and chemical processes can lead to mechanical stresses, in particular mechanical interface damage, such as, for example, cracks and/or delamination, in the gradient coil unit. Interface damage in the region of the primary coil, secondary coil and/or a cooling structure comprised by the gradient coil unit can cause leaks, spikes, and/or damage to a conductor structure comprised by the primary coil and/or secondary coil. This can intensify noise and/or vibration arising during the operation of the gradient coil unit. Vibration during the operation of the gradient coil unit can be transmitted to the magnetic resonance device, as a result of which the quality of the image data to be generated is impaired. The durability of the gradient coil unit may also be reduced, in particular due to material fatigue. At present, interface damage during the curing of the encapsulating material is reduced by adding inert fillers to the encapsulating material, such as, for example, silica flour.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

FIG. 4 is a view of an encapsulating pocket according to an exemplary embodiment.

FIG. 5 is a view of an encapsulating pocket according to an exemplary embodiment.

Figure 1:
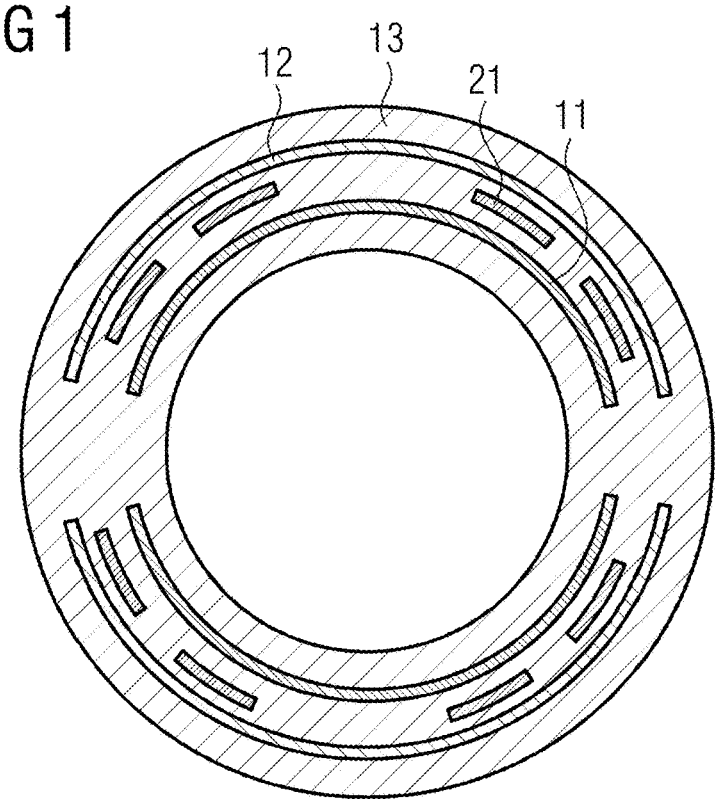
FIG. 1 is a view of a gradient coil unit according to a first exemplary embodiment.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

The disclosure is based on the object of disclosing a particularly robust gradient coil unit free of interface damage.

The gradient coil unit according to the disclosure comprises a primary coil, a secondary coil and a carrier unit, said carrier unit stabilizing the primary coil and the secondary coil and being formed from an encapsulating material. The carrier unit comprises at least one encapsulating pocket and the at least one encapsulating pocket comprises a delimiting structure comprising a first material, and a filling comprising a second material.

The encapsulating material typically comprises a resin, in particular a resin that can be crosslinked to form a thermoset, and/or an epoxide. In addition, the carrier unit can comprise a stabilizing structure for fixing the primary coil and the secondary coil with the encapsulating material.

The encapsulating pocket typically comprises a cavity at least partially at least at one point in time during the manufacture of the gradient coil unit. The first material and the second material typically differ from the encapsulating material. The first material and the second material typically differ from one another. The first material can correspond to the second material, in particular if each encapsulating pocket is constructed in a temporally successive manner. The gradient coil unit can also comprise two or more encapsulating pockets.

If the gradient coil unit comprises at least two encapsulating pockets, these are preferably arranged symmetrically within the gradient coil unit.

The delimiting structure can be embodied as an interface and/or an envelope. The delimiting structure typically surrounds a sealed, in particular hermetically sealed, region. The delimiting structure can form a cavity. The delimiting structure is typically deformable and/or elastic, provided that the delimiting structure is not embedded in the encapsulating material. The delimiting structure typically comprises areas that are typically able to move independently of one another to a large extent. The filling is typically completely surrounded and/or bordered by the delimiting structure.

The advantage of the gradient coil unit according to the disclosure consists in the fact that damage to interfaces is reduced by reducing the mechanical stress within the gradient coil unit. The encapsulating pockets enable elastic and/or plastic deformation during the curing of the encapsulating material, as a result of which the mechanism that leads to the interface damage is completely controllable. In particular, the encapsulating pockets can be easily integrated mechanically into a gradient coil unit. This is associated with increased mechanical integrity and higher usable power. The robustness and service life of the gradient coil unit according to the disclosure are increased. This reduces the maintenance effort and the costs of spare parts for the gradient coil unit.

One embodiment of the gradient coil unit provides that the gradient coil unit comprises exactly one encapsulating pocket, the carrier unit and the encapsulating pocket are embodied in a hollow cylindrical shape and the encapsulating pocket is at least 90%, preferably at least 95%, particularly preferably completely, surrounded by the carrier unit. This embodiment of the gradient coil unit is particularly simple to produce.

One embodiment of the gradient coil unit provides that the encapsulating pocket has an elongated extension parallel to the longitudinal axis of the gradient coil unit. The gradient coil unit is typically a hollow cylinder and the longitudinal axis is defined by this gradient coil unit shape. The encapsulating pocket is typically longitudinal and/or extends over at least 70%, preferably over at least 80%, preferably over at least 90% of the elongated extension of the gradient coil unit. The encapsulating pocket can also extend completely over the elongated extension of the gradient coil unit. Each encapsulating pocket is preferably arranged in a subregion of the gradient coil unit, said subregion having no functionality with respect to generating and/or screening and/or improving the homogeneity of a magnetic field and/or a magnetic field gradient.

This embodiment of the gradient coil unit, in particular the elongated extension of the encapsulating pocket, enables a particularly efficient and effective reduction of interface damage, since in particular stresses can be relieved over the entire length of the gradient coil unit.

One embodiment of the gradient coil unit provides that the gradient coil unit comprises at least two encapsulating pockets, said at least two encapsulating pockets having a first radial distance from the center of the gradient coil unit. According to this embodiment, the at least two encapsulating pockets have the same distance from the center of the gradient coil unit. This enables a uniform reduction of stresses in the gradient coil unit, as a result of which interface damage can be reduced to a particularly great extent.

One embodiment of the gradient coil unit provides that the gradient coil unit comprises at least two shim pockets, said at least two shim pockets in each case having an elongated extension parallel to the longitudinal axis of the gradient coil unit and a second radial distance from the center of the gradient coil unit, wherein the first radial distance differs from the second radial distance by 30% at the most.

Shim pockets are typically elongated cavities embodied to accommodate shim elements. Shim elements are typically elongated carriers and/or iron plates which are inserted and/or positioned and/or placed in the shim pockets in order to homogenize the basic magnetic field and/or the magnetic field gradient. Unlike encapsulating pockets, shim elements typically have no delimiting structure and/or no filling. Shim elements also typically comprise metal for electromagnetic interaction with the magnetic field gradients and/or the basic magnetic field.

This embodiment provides that the first radial distance differs from the second radial distance by 30% at the most, preferably 20% at the most, particularly preferably 10% at the most. The first radial distance can also differ from the second radial distance by a maximum of 5%, preferably by less than 3%. This enables a space-saving arrangement of the gradient coil unit since in particular the radial extension of the gradient coil unit required due to the shim pockets is efficiently also used for the encapsulating pockets. In addition, a gradient coil unit of this kind can be produced particularly efficiently. If the first radial distance differs from the second radial distance, the shim pockets and the encapsulating pockets can overlap in the circumferential direction, which increases the efficiency of the encapsulating pockets.

One embodiment of the gradient coil unit provides that the at least two shim pockets and the at least two encapsulating pockets are arranged in alternation. In particular, it is typically possible to exclude electromagnetic interaction between the shim elements to be inserted into the shim pockets and the encapsulating pockets due to the choice of the first material and second material. An alternating arrangement effects a particularly uniform reduction in the interface damage and/or stresses during encapsulation without impairing the quality of the function of the shim pockets, in particular the shim elements to be inserted therein.

One embodiment of the gradient coil unit provides that the first material comprises at least one of the following materials
  polymer
  composite, in particular Glass Reinforced Plastic (GRP)
  solid
and/or has at least one of the following embodiments:
  blown film
  molding
  elastomer
  foam.

A delimiting structure comprising one of the named materials and/or having one of the named embodiments is particularly simple and inexpensive to produce. The named materials are also elastic and/or flexible and enable elastic and/or plastic deformation, as a result of which they form a deformable interface when used as a delimiting structure. A delimiting structure of this kind preferably enables shear movements and/or extensively independent movements of areas comprised by the delimiting structure, wherein elastic or plastic deformation can relieve mechanical stresses. Relieving mechanical stresses actively prevents the occurrence of interface damage. This enables the delimiting structure to be impermeable after the curing of the encapsulating material and/or during the filling of the delimiting structure with the second material and/or when using the completed gradient coil unit and effects good elimination of interface damage.

One embodiment of the gradient coil unit provides that the delimiting structure was manufactured by means of 3D printing, twin sheet forming and/or plastic welding. A delimiting structure of this kind is particularly simple and inexpensive to produce.

One embodiment of the gradient coil unit provides that the second material comprises a thermoset and/or a thermoplastic and/or a gas and/or is viscous and/or elastic. The second material can in particular comprise a cold-curing thermosetting resin and/or a foam. Before the curing of the encapsulating material, the second material can in particular comprise a gas, for example air, and/or water. After the curing of the encapsulating material, the second material preferably comprises a thermoset and/or a thermoplastic. This results in the stabilization and/or fixation of the delimiting structure, as a result of which the mechanical integrity of the gradient coil unit is increased.

One embodiment of the gradient coil unit provides that the delimiting structure comprises two substantially parallel flexible longitudinal surface elements connected to one another at the edges. The longitudinal surface elements can, for example, be GRP plates. A delimiting structure of this kind meets the aforementioned conditions with regard to possibilities of movement of the delimiting structure during the curing of the encapsulating material very efficiently.

One embodiment of the gradient coil unit provides that the surface elements are each coated on at least one side with a thermoplastic film, in particular thermal lamination. In particular thermoplastic coating of the exterior of the delimiting structure, which rests on the encapsulating material of the gradient coil unit, is advantageous. Thermal lamination of this kind enables particularly good and free mobility of the delimiting structure during the curing of the encapsulating material. Thermal lamination of this kind also simplifies the production of the delimiting structure.

One embodiment of the gradient coil unit provides that the connection of the surface elements comprises a weld seam on the thermoplastic film. The weld seam enables a simple connection of the longitudinal surface elements, which in particular permits fee movement of the delimiting structure during the curing of the encapsulating material and at the same time is very stable. The weld seam can be created by means of radio-frequency welding.

One embodiment of the gradient coil unit provides that the at least one encapsulating pocket, in particular the delimiting structure thereof, has at least one opening for receiving the filling, in particular the second material. An opening can be a filling hose. This embodiment enables the delimiting structure to be filled after the curing of the encapsulating material. The at least one encapsulating pocket preferably has at least two openings so that pressure equalization can take place during filling. This enables stabilization of the delimiting structure for the operation of the gradient coil unit after curing.

One embodiment of the gradient coil unit provides that the reception of the filling comprising the second material in the encapsulating pocket takes place after the encapsulating material has cured. This enables a particularly good reduction of mechanical stresses since the deformable delimiting structure is adapted to the encapsulating material during curing. The reception of the filling after the curing of the encapsulating material enables the fixation of the deformed delimiting structure.

One embodiment of the gradient coil unit provides that the encapsulating pocket comprises at least one support structure. The support structure can, for example, be embodied as a reinforcing element, in particular as a glass fiber mat, and/or as a carrier structure on which a plurality of cushions are applied. This increases the mechanical integrity of the gradient coil unit. In particular, the support structure is suitable for keeping flow paths free for supplying the filling, in particular the second material.

One embodiment of the gradient coil unit provides that the support structure comprises at least one of the following materials:
  polymer
  composite
  glass fiber mat
  solid.

A support structure of this kind is simple and inexpensive to produce. A support structure of this kind also enables deformation of the delimiting structure during the curing of the encapsulating material and fixation during and after the supply of the filling.

One embodiment of the gradient coil unit provides that the support structure comprises a glass roving lattice fabric and/or was manufactured by means of GRP lattices and/or thermoforming and/or 3D printing. The support structure can also be impregnated with a thermoset, such as, for example, epoxy resin, and/or a thermoplastic. A support structure of this kind is simple and inexpensive to produce.

One embodiment of the gradient coil unit provides that the gradient coil unit was manufactured in accordance with the following method steps:
  encapsulating the primary coil, the secondary coil and the delimiting structure with the encapsulating material,
  curing the encapsulating material,
  filling the delimiting structure by introducing the second material into a region enclosed by the delimiting structure after the curing of the encapsulating material,
  curing the second material in the region enclosed by the delimiting structure.

Encapsulation is preferably performed at a temperature in the range of 60° C. to 120° C., preferably in the range of 70°

C. to 100° C., particularly preferably between 80° C. and 95° C. and/or with liquid and/or thermosetting resin. Herein, the primary coil, the secondary coil and the exterior of the delimiting structure are preferably completely surrounded by encapsulating material. Encapsulation is preferably performed under vacuum. The encapsulating material is typically cured at elevated temperatures in the range of 80° C. to 120° C. Here, a crosslinking reaction takes place, effecting chemical shrinkage of the thermosetting resin. Subsequent cooling to about 20° C. effects thermal shrinkage of the gradient coil unit. Curing of the encapsulating material typically results in deformation of the delimiting structure, said deformation reducing or preventing the formation of mechanical stresses in the gradient coil unit, in particular also in the encapsulating material, the primary coil and/or the secondary coil. During the filling of the delimiting structure, a cavity enclosed by the delimiting structure is preferably completely filled with the second material which is then cured. A gradient coil unit according to this embodiment is free of interface damage and hence particularly durable and robust during operation. In particular, a gradient coil unit of this kind has particularly high mechanical integrity.

One embodiment of the gradient coil unit provides that the at least one encapsulating pocket is enclosed by the encapsulating material of the gradient coil unit to an extent of more than 80%, typically more than 90%, in particular more than 95%. The at least one encapsulating pocket can also be completely enclosed by the encapsulating material of the gradient coil unit. This embodiment enables the encapsulating pockets to be particularly effective in eliminating interface damage to the gradient coil unit.

The disclosure is furthermore based on a thermoset component unit comprising an electronic component and a carrier unit, said carrier unit surrounding the electronic component and being formed from an encapsulating material, wherein the carrier unit comprises at least one encapsulating pocket and the at least one encapsulating pocket comprises a delimiting structure comprising a first material, and a filling comprising a second material. The thermoset component unit can be embodied as a gradient coil unit. The embodiments of the gradient coil unit according to the disclosure can also be transferred to the thermoset component unit. In particular, the first material of the gradient coil unit can correspond to the first material of the thermoset component unit and/or the second material of the gradient coil unit can correspond to the second material of the thermoset component unit. The at least one encapsulating pocket of the thermoset component unit can correspond to an embodiment of the encapsulating pocket of the gradient coil unit according to the disclosure. The advantages and/or embodiments of the gradient coil unit can also be transferred to the thermoset component unit.

FIG. 1 shows a gradient coil unit according to the disclosure in a first embodiment in a schematic depiction in a first view. The first view is a cross-section perpendicular to the longitudinal axis of the gradient coil unit. The gradient coil unit comprises a primary coil 11, a secondary coil 12 and a carrier unit 13, said carrier unit 13 stabilizing the primary coil 11 and the secondary coil 12 and being formed from an encapsulating material. The carrier unit 13 comprises a plurality of encapsulating pockets 21, wherein each encapsulating pocket 21 has a delimiting structure 22 comprising a first material, and a filling 23 comprising a second material. The gradient coil unit according to the disclosure is an embodiment of the thermoset component unit according to the disclosure, wherein the electronic component is embodied as a primary coil 11 and a secondary coil 12.

Figure 2:
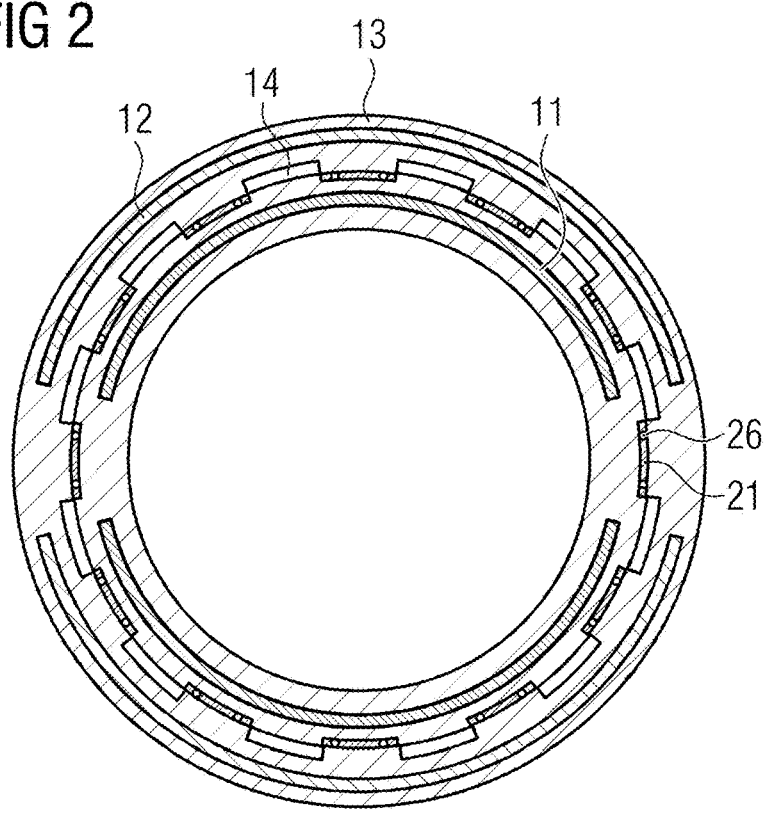
FIG. 2 is a view of a gradient coil unit according to a second exemplary embodiment.

FIG. 2 shows a gradient coil unit according to the disclosure in a second embodiment in a schematic depiction in a first view. According to this embodiment, the plurality of encapsulating pockets 21 are in each case, longitudinal and, in each case, arranged parallel to the longitudinal axis of the gradient coil unit. The plurality of encapsulating pockets 21 in each case have a first, i.e. the same, radial distance from the center of the gradient coil unit. The gradient coil unit according to this embodiment comprises a plurality of shim pockets 14 embodied as longitudinal in each case and arranged parallel to the longitudinal axis of the gradient coil unit. The shim pockets 14 have a second radial distance from the center of the gradient coil unit, wherein the second radial distance differs from the first radial distance by 30% at the most. The shim pockets 14 and the encapsulating pockets 21 are arranged in alternation. The encapsulating pockets 21 according to this embodiment of the gradient coil unit, in particular the delimiting structure 22, in each case have two openings 26 for receiving the filling. An opening 26 can, for example, be embodied as an extension and/or hose, for example along the longitudinal direction of the encapsulating pocket.

Figure 3:
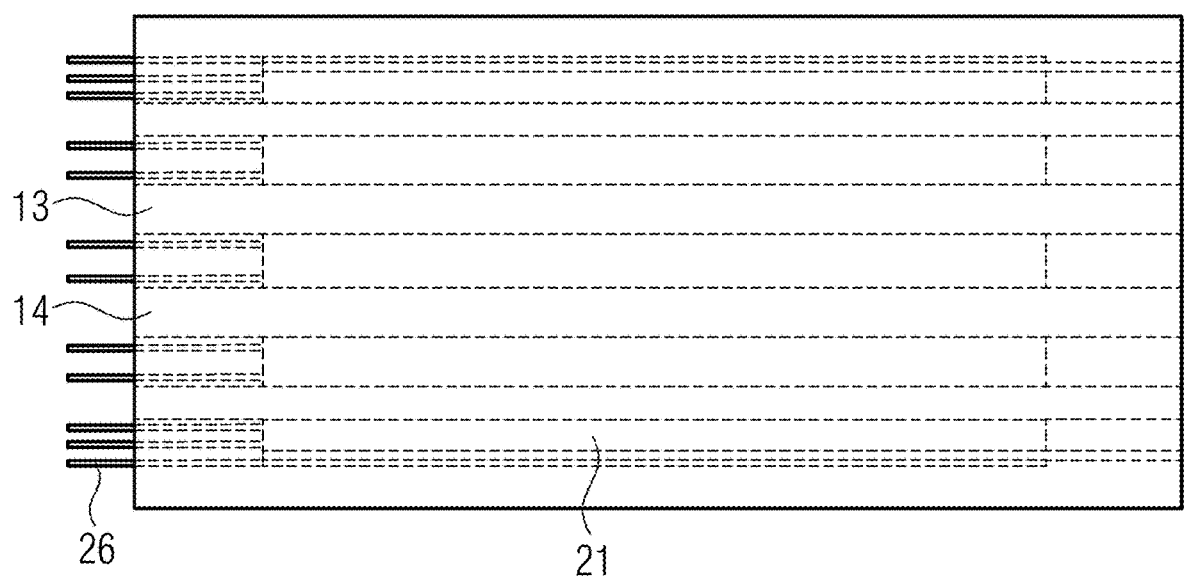
FIG. 3 is second view of the gradient coil unit of FIG. 2.

FIG. 3 shows a gradient coil unit according to the disclosure in the second embodiment in a schematic depiction in a second view. FIG. 3 depicts the embodiment depicted in FIG. 2 in a second view perpendicular to the first view. The primary coil 11 and the secondary coil 12 are not depicted for reasons of clarity. It may be identified in this depiction that the encapsulating pockets 26 are enclosed to an extent of more than 80%, typically more than 90%, in particular more than 95% by encapsulating material, i.e. by the carrier unit 13 of the gradient coil unit.

FIG. 4 shows a first embodiment of an encapsulating pocket 21 in a schematic depiction in a first view. The encapsulating pocket 21 has a delimiting structure 22 and a filling 23. The delimiting structure 22 has four openings 26 for receiving the filling 23 and for pressure equalization during the filling. The delimiting structure 22 can be manufactured by means of 3D printing, twin sheet forming and/or plastic welding. The second material for the filling can comprise a thermoset and/or a thermoplastic and/or a gas and/or be viscous and/or elastic.

FIG. 5 shows a second embodiment of an encapsulating pocket 21 in a schematic depiction in a first view. This embodiment differs from the embodiment depicted in FIG. 4 in that the encapsulating pocket 21 comprises a support structure 27. The filling 23 can be supplied to the encapsulating pocket 21 via at least one opening 26, wherein the filling 23 is typically distributed between the delimiting structure 22 and the support structure 27. The filling 23 is consequently arranged between the delimiting structure 22 and the support structure 27. In this embodiment, the support structure 27 is embodied in a lattice shape.

Figure 6:
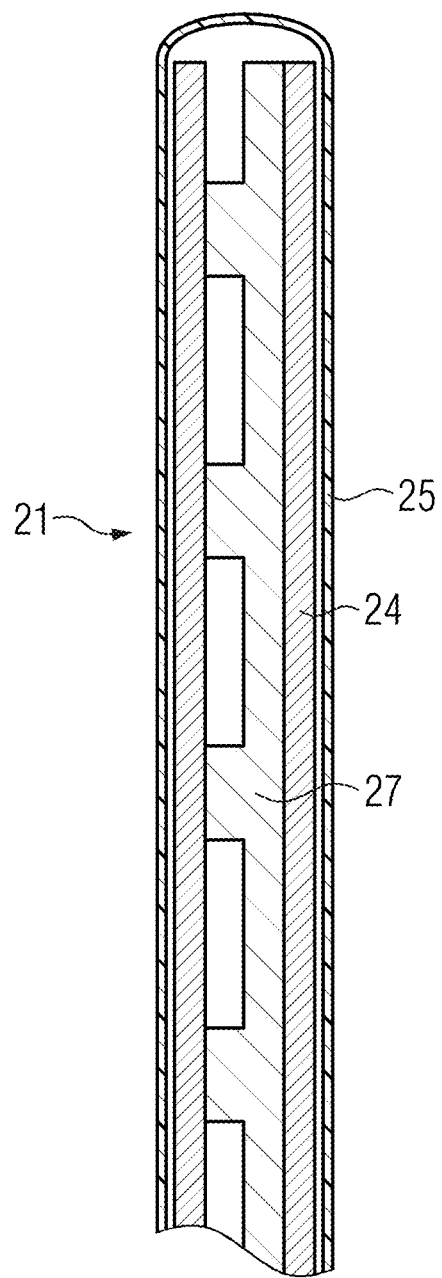
FIG. 6 is a view of an encapsulating pocket according to an exemplary embodiment.

FIG. 6 shows a third embodiment of an encapsulating pocket 21 in a schematic depiction in a second view. This third embodiment of the encapsulating pocket 21 can be a cutout of the second embodiment depicted in FIG. 5 in a second view perpendicular thereto.

According to the third embodiment, the delimiting structure 22 comprises two substantially parallel flexible longitudinal surface elements 24 connected to one another at the edges. For this purpose, the surface elements 24 are each coated with thermoplastic film 25 on the side facing away from the support structure 27. The connection of the surface elements 24 at the edges comprises a weld seam on the thermoplastic film 25.

Figure 7:
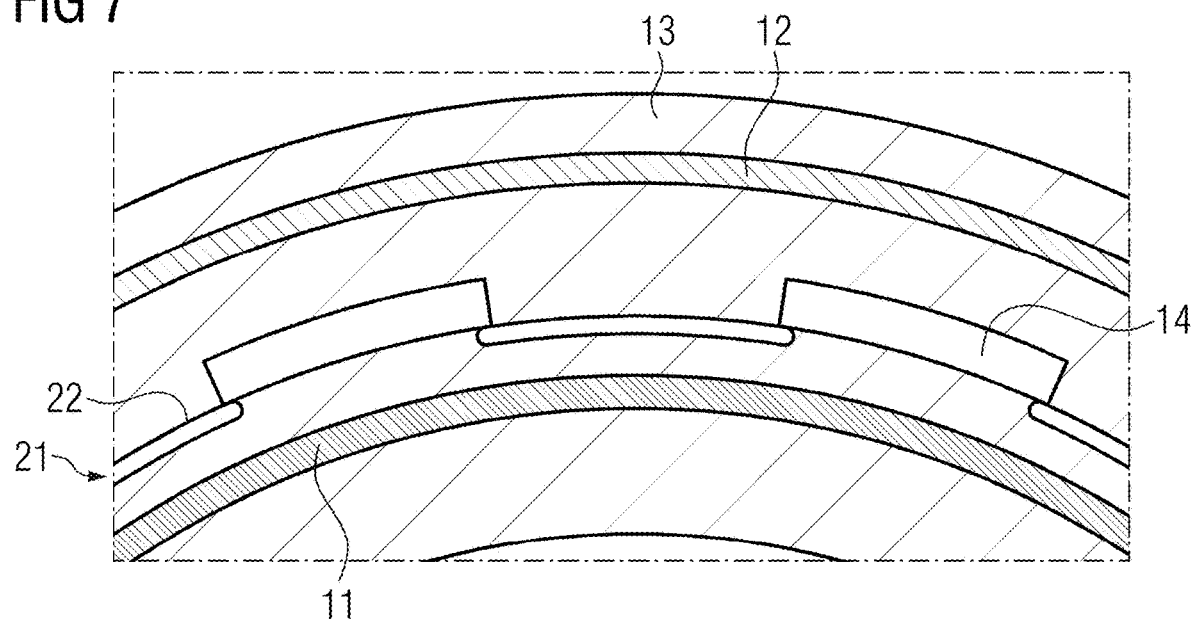
FIG. 7 is a view of a first subregion of a gradient coil unit according to an exemplary embodiment at the time of a first method step for manufacturing.
Figure 8:
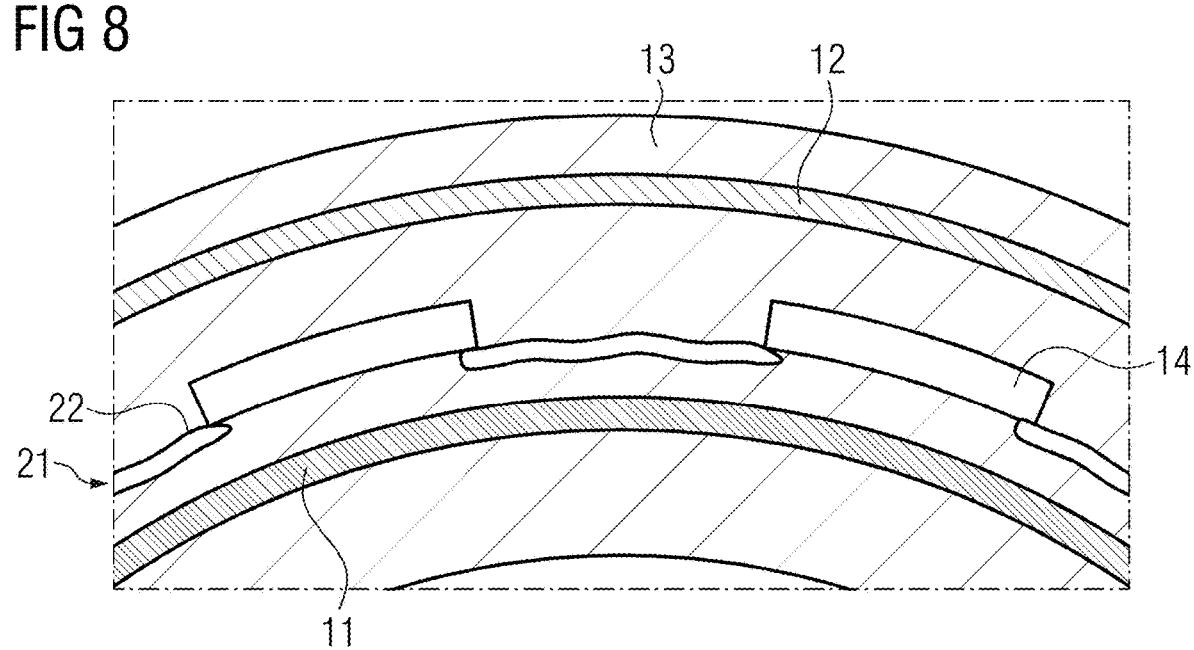
FIG. 8 is the first subregion of a gradient coil unit according to an exemplary embodiment at the time of a second method step for manufacturing.
Figure 9:
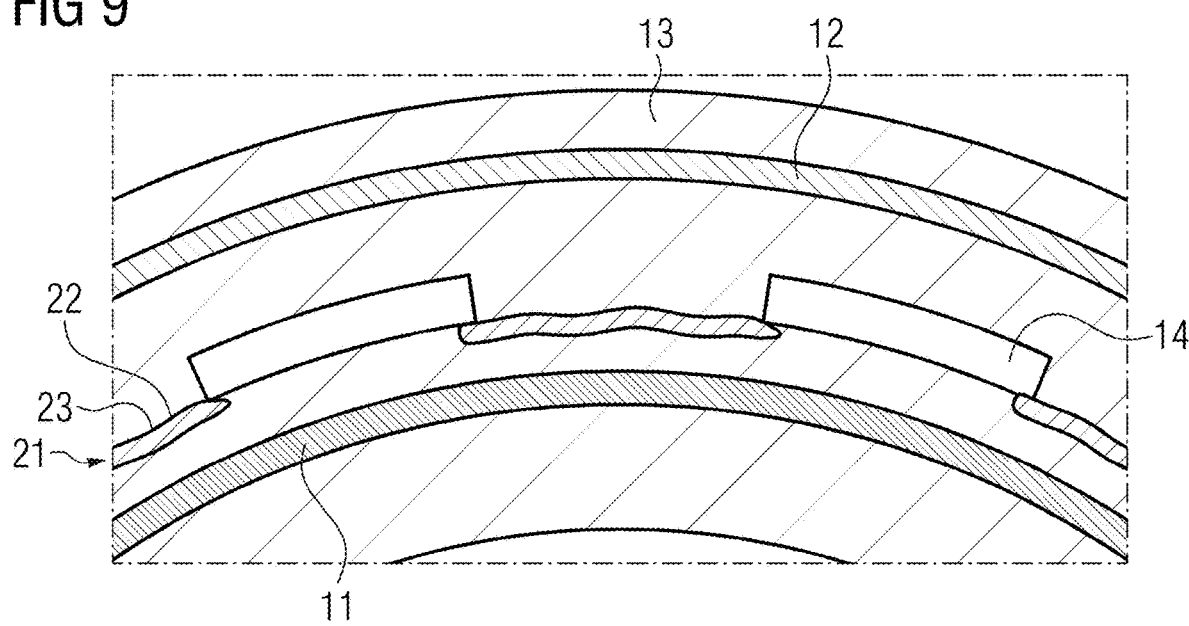
FIG. 9 is the first subregion of a gradient coil unit according to an exemplary embodiment at the time of a third method step for manufacturing.

FIGS. 7, 8 and 9 show a first subregion of a gradient coil unit according to the disclosure in an embodiment at the time of different method steps during the manufacture of the gradient coil unit. FIG. 7 shows the gradient coil unit after the encapsulation of the primary coil 11, the secondary coil 12 and the delimiting structure 22 with the encapsulating material, i.e. the carrier unit 13. FIG. 8 shows the gradient coil unit after the curing of the encapsulating material, which results in a change to the shape, in particular in the deformation of the delimiting structure 22. FIG. 9 shows the gradient coil unit after the filling 23 of the delimiting structure 22 by introducing the second material into a region enclosed by the deformed delimiting structure 22.

Although the disclosure has been illustrated and described in greater detail by the preferred exemplary embodiments, the disclosure is not restricted by the disclosed examples and other variations can be derived herefrom by the person skilled in the art without departing from the scope of protection of the disclosure.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

The invention claimed is:

1. A gradient coil unit comprising:
    a primary coil;
    a secondary coil; and
    a carrier configured to stabilize the primary coil and the secondary coil and being formed from an encapsulating material, wherein the carrier includes at least one encapsulating pocket including: a delimiting structure including a first material, and a filling including a second material.

2. The gradient coil unit as claimed in claim 1, wherein each of the at least one encapsulating pocket has an elongated extension parallel to a longitudinal axis of the gradient coil unit.

3. The gradient coil unit as claimed claim 1, comprising at least two encapsulating pockets, the at least two encapsulating pockets having a first radial distance from a center of the gradient coil unit.

4. The gradient coil unit as claimed in claim 3, wherein the gradient coil unit further comprises: at least two shim pockets each of which have an elongated extension parallel to the longitudinal axis of the gradient coil unit and a second radial distance from the center of the gradient coil unit, wherein the first radial distance differs from the second radial distance by at most 30%.

5. The gradient coil unit as claimed in claim 4, wherein the at least two shim pockets and the at least two encapsulating pockets are arranged in alternation.

6. The gradient coil unit as claimed in claim 1, wherein the gradient coil unit comprises exactly one encapsulating pocket, the carrier and the encapsulating pocket being embodied in a hollow cylindrical shape, wherein the encapsulating pocket is completely surrounded by the carrier.

7. The gradient coil unit as claimed in claim 1, wherein:
    the first material comprises at least one of the following materials: a polymer, a composite, and a solid; and/or
    the first material is embodied as at least one of the following: a blown film, a molding, an elastomer, and a foam.

8. The gradient coil unit as claimed in claim 1, wherein the delimiting structure is manufactured using three-dimensional (3D) printing, twin sheet forming, and/or plastic welding.

9. The gradient coil unit as claimed in claim 1, wherein the second material:
    comprises a thermoset, a thermoplastic, and/or a gas; and/or
    is viscous and/or elastic.

10. The gradient coil unit as claimed in claim 1, wherein the delimiting structure comprises two parallel, flexible longitudinal surface elements connected to one another at their respective edges.

11. The gradient coil unit as claimed in claim 10, wherein the two surface elements are each coated on at least one side with a thermoplastic film.

12. The gradient coil unit as claimed in claim 11, wherein the connection of the surface elements comprises a weld seam on the thermoplastic film.

13. The gradient coil unit as claimed in claim 1, wherein the delimiting structure of the at least one encapsulating pocket includes an opening configured to receive the second material of the filling.

14. The gradient coil unit as claimed in claim 13, wherein the opening is configured to receive the second material of the filling after the encapsulating material has cured.

15. The gradient coil unit as claimed in claim 1, wherein the at least one encapsulating pocket comprises at least one support structure.

16. The gradient coil unit as claimed in claim 15, wherein the at least one support structure comprises at least one of the following materials: a polymer, a composite, a glass fiber mat, and a solid.

17. The gradient coil unit as claimed in claim 15, wherein:
the support structure comprises a glass roving lattice fabric and/or
support structure has been manufactured using Glass Reinforced Plastic (GRP) lattices, thermoforming, and/or three-dimensional (3D) printing.

18. A method of manufacturing a gradient coil unit, comprising:
encapsulating an electronic component and a delimiting structure of at least one encapsulating pocket with an encapsulating material, the delimiting structure including a first material;
curing the encapsulating material;
introducing a second material into a region enclosed by the delimiting structure, after the curing of the encapsulating material, to fill the delimiting structure; and
curing the second material in the region enclosed by the delimiting structure.

19. The method as claimed claim 18, wherein the at least one encapsulating pocket is enclosed by the encapsulating material of the gradient coil unit to an extent of more than 95%.

20. A thermoset component unit comprising:
an electronic component; and
a carrier surrounding the electronic component, the carrier being formed from an encapsulating material, wherein the carrier includes at least one encapsulating pocket including: a delimiting structure including a first material, and a filling including a second material.

* * * * *